United States Patent [19]

Satoh

[11] Patent Number: 5,387,879
[45] Date of Patent: Feb. 7, 1995

[54] GAIN CONTROLLABLE OUTPUT BUFFER AMPLIFIER CIRCUIT HAVING A REDUCED CIRCUIT AREA

[75] Inventor: Noritoshi Satoh, Tokyo, Japan

[73] Assignee: NEC Corporation, Japan

[21] Appl. No.: 102,159

[22] Filed: Aug. 4, 1993

[30] Foreign Application Priority Data

Aug. 4, 1992 [JP] Japan .................................. 4-207682

[51] Int. Cl.⁶ .............................................. H03G 3/12
[52] U.S. Cl. .................................... 330/282; 330/86
[58] Field of Search ............... 330/86, 144, 278, 282, 330/284

[56] References Cited

U.S. PATENT DOCUMENTS 4,599,574  7/1986  Chambers ..................... 330/86 X

FOREIGN PATENT DOCUMENTS 3232310  10/1991  Japan ............................. 330/282

*Primary Examiner*—Steven Mottola
*Attorney, Agent, or Firm*—Laff, Whitesel, Conte & Saret, Ltd.

[57] ABSTRACT

A gain-controllable output buffer amplifier circuit includes an operational amplifier having a grounded non-inverting input and an inverting input connected through an input resistor to a signal input node. A tapped feedback resistor having a plurality of intermediate taps is connected between an output and the inverting input of the operational amplifier. Each of the intermediate taps is connected through a transistor switch in common to a non-inverting input of an output buffer amplifier, which has its output connected to a signal output node and an inverting input of the output buffer amplifier itself. The transistor switches are controlled by a switch control circuit in such a manner that only one of transistors switches is selectively turned on.

6 Claims, 2 Drawing Sheets

5,387,879

GAIN CONTROLLABLE OUTPUT BUFFER AMPLIFIER CIRCUIT HAVING A REDUCED CIRCUIT AREA

BACKGROUND OF THE INVENTION

1. Field of the Invention

The present invention relates to an output buffer amplifier circuit, and more specifically to a gain controllable output buffer amplifier circuit to be incorporated in a semiconductor integrated circuit.

2. Description of Related Art

Some typical output buffer amplifier circuit of this type known to the inventor includes an operational amplifier having an inverting input connected through an input resistor to a signal input terminal, and an output buffer amplifier having a non-inverting input connected directly to an output of the operational amplifier and an output connected to an output terminal. A tapped feedback resistor is connected between the output and the inverting input of the operation amplifier, and each of a plurality of taps of the feedback resistor is connected through a corresponding transistor switch to the output of the operation amplifier. The transistor switches are controlled by a switch control circuit so that the transistor switches are selectively turned on and off.

In the above mentioned output buffer amplifier circuit, an amplification factor, namely a ratio of an output signal to an input signal, is determined by a ratio of an effective resistance of the feedback resistor to a resistance of the input resistor. Therefore, since the effective resistance of the feedback resistor can be adjusted by selectively turning on the transistor switches by action of the switch control circuit, the gain of the overall output buffer amplifier circuit can be controlled.

In the above mentioned output buffer amplifier circuit, each of the transistor switches for determining the amplification factor is connected between the output of the operational amplifier and the corresponding tap of the feedback resistor. Since the operational amplifier is ordinarily designed to have a low output impedance, a current flows from the selected tap of the feedback resistor through the turned-on transistor switch to the output impedance of the operational amplifier. Accordingly, the amplification factor is not determined by only the feedback resistor, but determined by the ratio between the input resistance and an effective feedback resistance including the feedback resistor and the on-resistance of the transistor switch. The on-resistance of the transistor switch varies dependently upon a voltage applied across the transistor switch. Since the voltage applied across the transistor switch varies dependently upon the input signal level, the amplification factor accordingly varies dependently upon the input signal level.

In this connection, it can be considered that the variation of the amplification factor can be reduced or prevented by minimizing the variation of the voltage applied across the turned-on transistor switch in comparison with the feedback resistance. For this purpose, however, it is necessary either to enlarge the feedback resistor or to scale up the size of the transistor switches. This means that the size of the circuit components becomes large, and therefore, this way cannot be adopted in certain applications of the output buffer amplifier circuit. In particular, the output buffer amplifier circuit has to be small when the circuit is implemented in an integrated circuit.

SUMMARY OF THE INVENTION

Accordingly, it is an object of the present invention to provide an output buffer amplifier circuit which has overcome the above mentioned defect of the output buffer amplifier circuit mentioned above.

Another object of the present invention is to provide a gain-controllable output buffer amplifier circuit which can be realized in a chip area smaller than that required in the gain-controllable output buffer amplifier circuit mentioned above.

The above and other objects of the present invention are achieved in accordance with the present invention by an output buffer amplifier circuit comprising:
  an operational amplifier having an inverting input and a non-inverting input one of which is connected to a signal input node;
  a feedback resistor having its one end connected to an output of the operational amplifier and its other end connected to the inverting input of the operational amplifier, the feedback resistor having a plurality of intermediate taps;
  a corresponding number of transistor switches each of which has its one end connected to a corresponding one of the plurality of intermediate taps of the feedback resistor;
  an output buffer amplifier having its input connected in common to the other end of each of the transistor switches, an output of the output buffer amplifier being connected to an output node; and
  a switch control circuit connected to a control input of each of the transistor switches so as to turn on only a selected one of the transistor switches.

The above and other objects, features and advantages of the present invention will be apparent from the following description of preferred embodiments of the invention with reference to the accompanying drawings.

DESCRIPTION OF THE PREFERRED EMBODIMENTS

Figure 1:
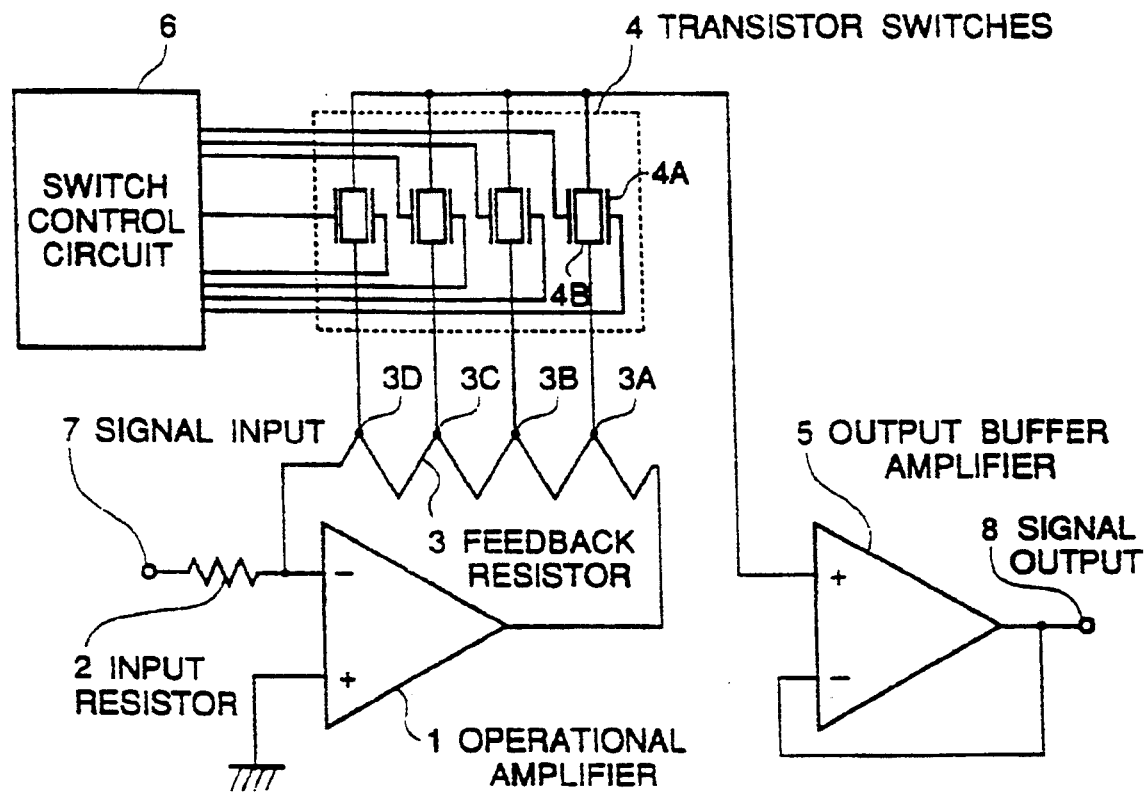
FIG. 1 is a circuit diagram of a first embodiment of the gain-controllable output buffer amplifier circuit in accordance with the present invention.

Referring to FIG. 1, there is shown a circuit diagram of a first embodiment of the gain-controllable output buffer amplifier circuit in accordance with the present invention.

The shown gain-controllable output buffer amplifier circuit includes an operational amplifier 1 having a grounded non-inverting input (designated with Sign "+"(plus)) and an inverting input (designated with Sign "−"(minus)) connected through an input resistor 2 to a signal input node 7. A tapped feedback resistor 3 is connected at its one end to an output of the operational amplifier 1 and at its other end to the inverting input of the operational amplifier. This feedback resistor 3 has a plurality of intermediate taps, for example, four taps 3A, 3B, 3C and 3D in the shown circuit.

Each of the taps 3A, 3B, 3C and 3D is connected through a transistor switch 4 in common to a non-inverting input (designated with Sign "+"(plus)) of an output buffer amplifier 5. An output of the output buffer amplifier 5 is connected to a signal output node 8, and also connected to an inverting input (designated with Sign "−"(minus)) of the output buffer amplifier 5 itself.

A control input of each transistor switch 4 is connected to a switch control circuit 6 so that the transistor switches 4 are controlled by the switch control circuit 6 in such a manner that only one of transistor switches 4 is selectively turned on. For example, each transistor switch 4 can be formed of a CMOS transfer gate composed of a P-channel MOS transistor 4A and an N-channel MOS transistor 4B connected in parallel to each other. Gates of the P-channel MOS transistor and the N-channel MOS transistor constitute the control input of each transistor switch 4, and are respectively connected to receive a pair of complementary control signals from the switch control circuit 6.

In the shown output buffer amplifier circuit, a signal applied through the signal input node 7 is amplified by the operational amplifier 1 with an amplification factor determined by a ratio to the input resistance 2 of a resistance which starts from the tap that is connected to one transistor switch closed by the switch control circuit 6 and which reaches the inverting input of the operation amplifier 1. The amplified signal is applied to the non-inverting input of the output buffer amplifier 5, and is outputted from the output of the output buffer amplifier 5 connected in the form of a voltage follower.

In this embodiment, the transistor switches 4 are connected between the feedback resistor 3 and the non-inverting input of the output buffer amplifier 5. Since the non-inverting input of the output buffer amplifier 5 has a high impedance, a current flowing through the closed transistor switch can be deemed to be almost zero. In other words, the on-resistance of the closed transistor switch can be neglected. Accordingly, the variation of the on-resistance of the closed transistor switch caused by the variation of the voltage appearing across the transistor switch will give no substantial adverse effect.

In addition, in the shown embodiment, even if the taps of the feedback resistor 3 are switched over by the transistor switches 4, the resistance value attributable to the feedback (namely, the resistance of the whole of the feedback resistor 3 in the circuit shown in FIG. 1) remains unchanged, and therefore, the amplification factor of an amplifying circuit composed of the operational amplifier 1 and the feedback resistor 3 is constant. The change of the amplification factor in the output buffer amplifier circuit is realized by changing a ratio of dividing a potential difference between the output and the inverting input of the operational amplifier 1, by means of the switching over of the taps of the feedback resistor 3. In this connection, in the output buffer amplifier circuit as mentioned under "Description of related art", if the taps of the feedback resistor are switched over, the resistance value attributable to the feedback changes, and therefore, the amplification factor of an amplifying circuit composed of the operational amplifier and the feedback resistor changes correspondingly. In other words, the change of the amplification factor of the output buffer amplifier circuit mentioned under "Description of related art" is given by the change in the amplification factor of the amplifying circuit constituting a part of the output buffer amplifier circuit.

As can be seen from the above, the shown embodiment has a feature in which there is no correlation between the size of the feedback resistor 3 and the transistor size of the transistor switches 4. Therefore, the size of the feedback resistor 3 and the transistor size of the transistor switches 4 can be optimized independently of each other, so as to miniaturize the output buffer amplifier circuit. This is very advantageous in the case that the output buffer amplifier circuit in accordance with the present invention is incorporated in an integrated circuit.

In a simulation, in the case of the output buffer amplifier circuit having such a specification that (1) the amplification factor is adjustable in the range of −8 dB to −6 dB; (2) the voltage between the opposite ends of the transistor switch varies in the range of 1 V to 3.8 V; and (3) the variation of the amplification factor is limited in the extent of ±0.1 dB, the output buffer amplifier circuit as mentioned under "Description of related art" has to be designed so that if the feedback resistor is designed to have a 20K Ω, the transistor switches are sized to have the channel length L of 1.75 $\mu$m and the channel width W of 600 $\mu$m, or alternatively, it the transistor switches are designed to have the size of L=1.75 $\mu$m and W=5 $\mu$m, the feedback resistor is sized to have a resistance of 270K Ω. In other words, either the very large transistors or the very large resistor is required in the output buffer amplifier circuit as mentioned under "Description of related art".

In the shown embodiment, to the contrary, since the size of the feedback resistor 3 and the transistor size of the transistor switches 4 can be determined independently of each other, it is possible to reduce the size of the feedback resistor 3 and the transistor size of the transistor switches 4.

Figure 2:
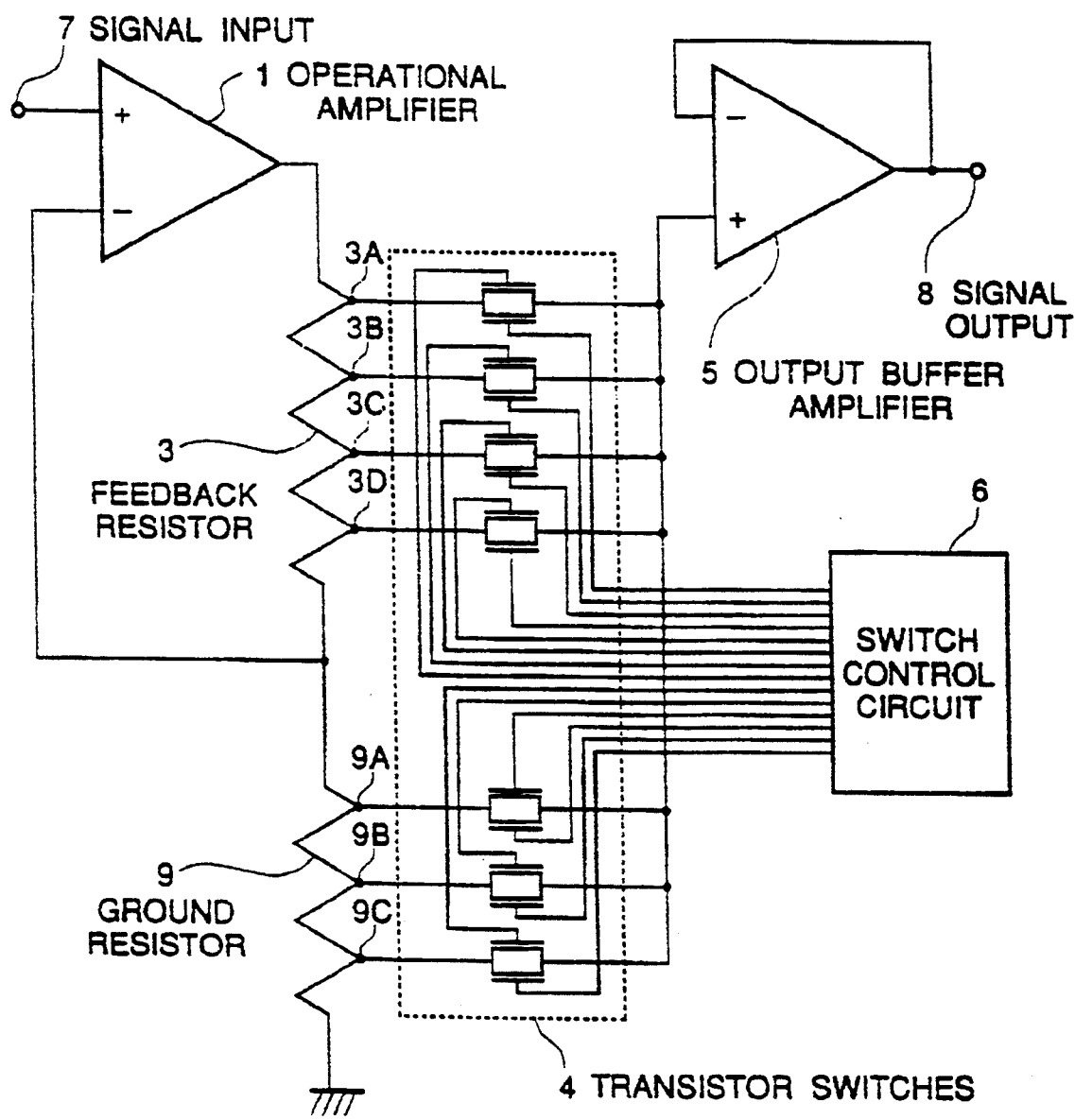
FIG. 2 is a circuit diagram of a second embodiment of the gain-controllable output buffer amplifier circuit in accordance with the present invention.

Referring to FIG. 2, there is shown a circuit diagram of a second embodiment of the output buffer amplifier circuit in accordance with the present invention. In FIG. 2, elements similar to those shown in FIG. 1 are given the same Reference Numerals.

The second embodiment of the gain-controllable output buffer amplifier circuit includes an operational amplifier 1 having a non-inverting input connected directly to a signal input node 7. A tapped feedback resistor 3 is connected between an output and an inverting input of the operational amplifier 1. This feedback resistor 3 has a plurality of intermediate taps, for example, four taps 3A, 3B, 3C and 3D in the shown circuit. The inverting input of the operational amplifier 1 is also connected to the ground through a tapped ground resistor 9, which has a plurality of intermediate taps, for example, four taps 9A, 9B and 9C in the shown circuit.

Each of the taps 3A, 3B, 3C and 3D and 9A, 9B and 9C is connected through a transistor switch 4 in common to a non-inverting input of an output buffer amplifier 5. An output of the output buffer amplifier 5 is connected to a signal output node 8, and also connected to an inverting input of the output buffer amplifier 5 itself.

A control input of each transistor switch 4 is connected to a switch control circuit 6 so that the transistor switches 4 are controlled by the switch control circuit 6 in such a manner that only one of transistor switches 4 is selectively turned on.

This second embodiment will operate similarly to the first embodiment, and therefore, a further explanation will be omitted.

As will be understood from the above, the second embodiment has a non-inverting feedback amplification circuit including the operational amplifier and the feedback resistor, differently from the first embodiment having an inverting feedback amplification circuit in which the input resistor is connected between the signal input terminal and the inverting input of the operational amplifier. Therefore, the second embodiment can realize a non-inverting gain controllable output buffer amplifier circuit.

As will be apparent from the above description with reference to the drawings, the gain controllable output buffer amplifier circuit in accordance with the present invention is characterized in that the transistor switches for determining the amplification factor of the gain controllable output buffer amplifier circuit are connected to the high impedance non-inverting input of the output buffer amplifier, so that almost no current flows through the closed transistor switch, and therefore, the on-resistance of the closed transistor switch can be neglected. Accordingly, the variation of the on-resistance of the closed transistor switch caused by the variation of the input signal level will give no substantial adverse effect to the amplification factor of the gain controllable output buffer amplifier circuit.

Thus, since the size of the feedback resistor and the transistor size of the transistor switches for determining the amplification factor of the gain controllable output buffer amplifier circuit can be determined independently of each other, it is possible to make the size of the respective circuit elements smaller than those of the output buffer amplifier circuit mentioned under "Description of related art". Namely, it is possible to minimize the required circuit area. This is very advantageous in the case that the output buffer amplifier circuit in accordance with the present invention is incorporated in an integrated circuit.

The invention has thus been shown and described with reference to the specific embodiments. However, it should be noted that the present invention is in no way limited to the details of the illustrated structures but changes and modifications may be made within the scope of the appended claims.

I claim:
1. An output buffer amplifier circuit comprising:
an operational amplifier having an inverting input and a non-inverting input, one of which is connected to a signal input node, said inverting input of said operational amplifier being connected through an input resistor to said signal input node, said non-inverting input of said operational amplifier being connected directly to the ground;
a feedback resistor having its one end connected to an output of said operational amplifier and its other end connected to said inverting input of said operational amplifier, said feedback resistor having a plurality of intermediate taps;
a corresponding number of transistor switches each of which has its one end connected to a corresponding one of said plurality of intermediate taps of said feedback resistor, each of said transistor switches being formed of a CMOS transfer gate composed of a P-channel MOS transistor and an N-channel MOS transistor connected in parallel to each other,
an output buffer amplifier having its input connected in common to the other end of each of said transistor switches, an output of said output buffer amplifier being connected to an output node; and
a switch control circuit connected to a control input of said transistor switches so as to turn on only a selected one of said transistor switches, gates of said P-channel MOS transistor and said N-channel MOS transistor being connected to receive a pair of complementary control signals from said switch control circuit.

2. An output buffer amplifier circuit comprising:
an operational amplifier having an inverting input and a non-inverting input, one of which is connected to a signal input node, said non-inverting input of said operational amplifier being connected directly to said signal input node, and said inverting input of said operational amplifier being connected through a ground resistor to the ground;
a feedback resistor having its one end connected to an output of said operational amplifier and its other end connected to said inverting input of said operational amplifier, said feedback resistor having a plurality of intermediate taps;
a corresponding number of transistor switches each of which has its one end connected to a corresponding one of said plurality of intermediate taps of said feedback resistor;
an output buffer amplifier having its input connected in common to the other end of each of said transistor switches, an output of said output buffer amplifier being connected to an output node; and
a switch control circuit connected to a control input of said transistor switches so as to turn on only a selected one of said transistor switches.

3. A output buffer amplifier circuit claimed in claim 2 wherein ground resistor has a plurality of intermediate taps, which are connected through corresponding transistor switches in common to said input of said output buffer amplifier, and said transistor switches connected to said taps of said feedback resistor and said transistor switches connected to said taps of said ground resistor are controlled by said switch control circuit so that only one of these transistor switches are turned on.

4. A output buffer amplifier circuit claimed in claim 3 wherein each of said transistor switches is formed of a CMOS transfer gate composed of a P-channel MOS transistor and an N-channel MOS transistor connected in parallel to each other, gates of said P-channel MOS transistor and said N-channel MOS transistor being connected to receive a pair of complementary control signals from said switch control circuit.

5. An output buffer amplifier circuit comprising:
an amplification circuit connected to a signal input node and having an operational amplifier and a feedback resistor having its one end connected to an output of said operational amplifier and its other end connected to an inverting input of said operational amplifier, said operational amplifier having a non-inverting input connected directly to said signal input node, and said inverting input of said operational amplifier being connected through a ground resistor to the ground, so that said amplification circuit has a constant amplification factor, said feedback resistor having a plurality of intermediate taps;
a corresponding number of transistor switches each of which has its one end connected to a corresponding one of said plurality of intermediate taps of said feedback resistor;
an output buffer amplifier having a high impedance input connected in common to the other end of each of said transistor switches, an output of said output buffer amplifier being connected to an output node; and a switch control circuit connected to a control input of said transistor switches so as to turn on only a selected one of said transistor switched.

6. A output buffer amplifier circuit claimed in claim 5 wherein ground resistor has a plurality of intermediate taps, which are connected through corresponding transistor switches in common to said input of said output buffer amplifier, and said transistor switches connected to said taps of said feedback resistor and said transistor switches connected to said taps of said ground resistor are controlled by said switch control circuit so that only one of these transistor switches are turned on.

* * * * *